United States Patent
He et al.

(10) Patent No.: US 9,991,255 B2
(45) Date of Patent: Jun. 5, 2018

(54) FINFETS WITH NON-MERGED EPITAXIAL S/D EXTENSIONS ON A SEED LAYER AND HAVING FLAT TOP SURFACES

(71) Applicants: INTERNATIONAL BUSINESS MACHINES CORPORATION, Armonk, NY (US); Renesas Electronics Corporation, Kanagawa (JP)

(72) Inventors: Hong He, Schenectady, NY (US); Shogo Mochizuki, Tokyo (JP); Chiahsun Tseng, Wynantskill, NY (US); Chun-Chen Yeh, Clifton Park, NY (US); Yunpeng Yin, Schenectady, NY (US)

(73) Assignees: INTERNATIONAL BUSINESS MACHINES CORPORATION, Armonk, NY (US); RENESAS ELECTRONICS CORPORATION, Kanagawa (JP)

( * ) Notice: Subject to any disclaimer, the term of this patent is extended or adjusted under 35 U.S.C. 154(b) by 0 days. days.

(21) Appl. No.: 14/661,590

(22) Filed: Mar. 18, 2015

(65) Prior Publication Data
US 2015/0206877 A1 Jul. 23, 2015

Related U.S. Application Data

(62) Division of application No. 14/011,186, filed on Aug. 27, 2013, now Pat. No. 9,059,002.

(51) Int. Cl.
*H01L 27/088* (2006.01)
*H01L 29/04* (2006.01)
(Continued)

(52) U.S. Cl.
CPC ...... *H01L 27/0886* (2013.01); *H01L 21/0257* (2013.01); *H01L 21/02271* (2013.01);
(Continued)

(58) Field of Classification Search
CPC .......... H01L 21/02271; H01L 21/0257; H01L 21/30604; H01L 21/823431;
(Continued)

(56) References Cited

U.S. PATENT DOCUMENTS 7,385,247 B2 * 6/2008 Rhee ................. H01L 29/66795
257/329
7,851,865 B2 12/2010 Anderson et al.
(Continued)

OTHER PUBLICATIONS

Basker, V., et al. "A 0.063 UM2 FINFET SRAM Cell Demonstration With Conventional Lithography Using a Novel Integration Scheme With Aggressively Scaled Fin and Gate Pitch" 2010 Symposium on VLSI Technology Digest of Technical Papers. Jun. 2010. pp. 19-20.
(Continued)

*Primary Examiner* — Marc Armand
*Assistant Examiner* — Younes Boulghassoul
(74) *Attorney, Agent, or Firm* — Tutunjian & Bitetto, P.C.; Vazken Alexanian

(57) ABSTRACT

Semiconductor devices having non-merged fin extensions. A semiconductor device includes fins formed in trenches in an insulator layer, each of the fins having a uniform crystal orientation and a fin cap in a source and drain region that extends vertically and laterally beyond the trench. The fin caps of the respective fins are separate from one another.

11 Claims, 5 Drawing Sheets

(51) Int. Cl.
   *H01L 29/06* (2006.01)
   *H01L 29/78* (2006.01)
   *H01L 29/66* (2006.01)
   *H01L 21/02* (2006.01)
   *H01L 21/306* (2006.01)
   *H01L 21/8234* (2006.01)
   *H01L 29/08* (2006.01)

(52) U.S. Cl.
   CPC ........... *H01L 21/30604* (2013.01); *H01L 21/823431* (2013.01); *H01L 21/823437* (2013.01); *H01L 21/823481* (2013.01); *H01L 29/045* (2013.01); *H01L 29/0649* (2013.01); *H01L 29/0653* (2013.01); *H01L 29/0847* (2013.01); *H01L 29/6681* (2013.01); *H01L 29/66545* (2013.01); *H01L 29/66795* (2013.01); *H01L 29/785* (2013.01); *H01L 29/7851* (2013.01)

(58) Field of Classification Search
   CPC ..... H01L 21/823437; H01L 21/823481; H01L 21/02; H01L 21/8234; H01L 21/311; H01L 21/0217; H01L 21/02167; H01L 21/0214; H01L 21/31111; H01L 21/76224; H01L 21/76; H01L 21/845; H01L 21/823821; H01L 27/0886; H01L 27/088; H01L 27/0924; H01L 27/10826; H01L 27/10879; H01L 27/1211; H01L 23/3171; H01L 23/291; H01L 29/045; H01L 29/0649; H01L 29/0653; H01L 29/0847; H01L 29/66545; H01L 29/66795; H01L 29/6681; H01L 29/785; H01L 29/7851; H01L 29/06; H01L 29/66; H01L 29/04; H01L 29/08; H01L 29/02532; H01L 29/78; H01L 29/56; H01L 29/6653; H01L 29/1054; H01L 29/41791; H01L 29/66772; H01L 29/7831; H01L 29/66636; H01L 29/165; H01L 29/7848

USPC ....... 257/347, 401, 255, 288, 410, 368, 365; 438/478, 283, 694, 400, 150
   See application file for complete search history.

(56) References Cited

U.S. PATENT DOCUMENTS

| | | | |
|---|---|---|---|
| 8,703,556 B2* | 4/2014 | Kelly | H01L 29/66795 257/296 |
| 9,171,925 B2* | 10/2015 | Kuo | H01L 29/66545 |
| 9,214,556 B2* | 12/2015 | Wann | H01L 29/785 |
| 2011/0049583 A1 | 3/2011 | Lin et al. | |
| 2011/0079829 A1 | 4/2011 | Lai et al. | |
| 2012/0025316 A1 | 2/2012 | Schultz | |
| 2012/0043610 A1 | 2/2012 | Cheng et al. | |
| 2012/0104472 A1 | 5/2012 | Xu et al. | |
| 2012/0138886 A1* | 6/2012 | Kuhn | B82Y 10/00 257/9 |
| 2013/0089958 A1 | 4/2013 | Yeh et al. | |
| 2013/0200395 A1* | 8/2013 | Liaw | H01L 27/11 257/77 |
| 2013/0277686 A1* | 10/2013 | Liu | H01L 29/6653 257/77 |
| 2014/0042500 A1* | 2/2014 | Wann | H01L 29/41791 257/288 |
| 2014/0252489 A1* | 9/2014 | Yu | H01L 29/66795 257/368 |
| 2014/0264488 A1* | 9/2014 | Fronheiser | H01L 29/66795 257/288 |
| 2015/0035046 A1* | 2/2015 | Kim | H01L 29/42392 257/327 |
| 2015/0035069 A1* | 2/2015 | Hung | H01L 21/845 257/369 |
| 2015/0041918 A1* | 2/2015 | Wann | H01L 29/785 257/401 |

OTHER PUBLICATIONS

Guillorn, M., et al. "FINFET Performance Advantage at 22NM: An AC Perspective" 2008 Symposium on VLSI Technology Digest of Technical Papers. Jun. 2008. pp. 12-13.

Final Office Action for U.S. Appl. No. 14/666,464 dated Nov. 18, 2016 (11 pages).

* cited by examiner ns with non-merged fin extensions in accor-
FINFETS WITH NON-MERGED EPITAXIAL S/D EXTENSIONS ON A SEED LAYER AND HAVING FLAT TOP SURFACES

RELATED APPLICATION INFORMATION

This application is a Divisional application of co-pending U.S. patent application Ser. No. 14/011,186 filed on Aug. 27, 2013, incorporated herein by reference in its entirety.

BACKGROUND

Technical Field

The present invention relates to semiconductor device fabrication and, more particularly, to merged fins in the source and drain regions of fin-based field effect transistors.

Description of the Related Art

When forming replacement metal gate fin field effect transistors (FinFETs), the portions of the fins in the source and drain regions are often merged to form a single conductive terminal. A gate spacer is formed, protecting the fins in the area under the gate, and the fins outside the gate spacer are epitaxially grown until neighboring fins come into contact with one another.

However, because the fins display both <110> and <100> crystalline surfaces, simple epitaxial growth of the existing fins may cause defects, particularly in growth from <110> surfaces. Furthermore, uncontrolled epitaxial growth is effective at partially merging fins, but it can be difficult to control and suppress that merge in desired locations.

SUMMARY

A semiconductor device includes fins formed in trenches in an insulator layer, each of the fins having a uniform crystal orientation and a fin cap in a source and drain region that extends vertically and laterally beyond the trench. The fin caps of the respective fins are separate from one another.

A semiconductor device includes a plurality of fins formed in trenches in an insulator layer, each of the plurality of fins having a uniform crystal orientation. The fins each include an etched seed layer and an in situ doped, epitaxially grown fin extension in a source and drain region that extends vertically and laterally beyond the trench. The fin extensions of the respective fins are separate from one another.

A semiconductor device includes an insulator layer formed on a substrate. A plurality of fins is formed in trenches in the insulator layer, with each of the plurality of fins having a uniform crystal orientation. The fins each have an etched seed layer and an in situ doped, epitaxially grown fin extension in a source and drain region that extends vertically and laterally beyond the trench. The fin extensions of the respective fins are separate from one another. A gate structure is formed over the plurality of fins between the source and drain regions. The insulator layer rises to a height on the sidewall of the gate structure that is about a same height as portions of the plurality of fins underneath the gate structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
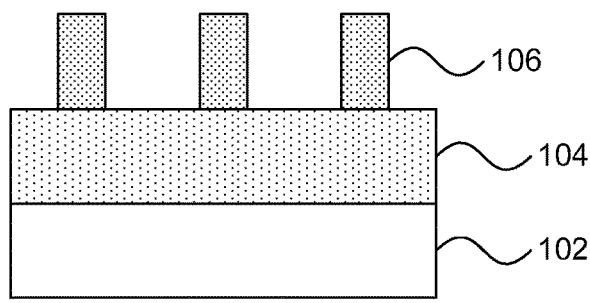
FIG. 1 is a cross-sectional view of a step in forming field effect transistors having non-merged fin extensions in accordance with the present principles.

Embodiments of the present principles provide the merging of fins in metal oxide semiconductors field effect transistors (MOSFETs) by surrounding the fins with a dielectric fill and recessing the fins below the level of the surrounding dielectric. This leaves only the top surface of the fins exposed such that subsequent epitaxial grown occurs on only the <100> crystal surface. When the growth extends beyond the surface of the dielectric fill, growth continues laterally as well as vertically, allowing the fins to expand without introducing the defects that commonly occur in <110> growth.

Merged fins are often used to decrease the spreading resistance experienced by charged carriers when traveling from the end of a channel to the contact. Providing a larger volume of highly doped semiconductor lowers the resistance in comparison to simple fins. Merging the fins by epitaxial growth, however, induces higher parasitic capacitance coupling from the gate to the material between the fins. This parasitic capacitance can reduce the performance of the device. Embodiments of the present invention provide fin extensions that increase the volume of the contacts without actually merging the fins, thereby providing the benefits of merged fins without triggering the increase in parasitic capacitance coupling.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cutaway view of a step in forming non-merged source/drain regions is shown. In this step, semiconductor fins 106 are formed on an insulator layer 104 above a bulk substrate layer 102. Although the present embodiments will be disclosed in the context of a semiconductor-on-insulator substrate, it should be understood that a bulk substrate embodiment is also contemplated. The substrate layer 102 may include, for example, a semiconductor such as silicon or any other appropriate substrate material. The insulator layer 104 may be formed from a buried oxide such as, e.g., silicon dioxide. The semiconductor fins 106 may be formed from silicon or from any other appropriate semiconductor such as silicon germanium. The fins 106 may furthermore be doped with, e.g., phosphorus or any other appropriate dopant.

Figure 2:
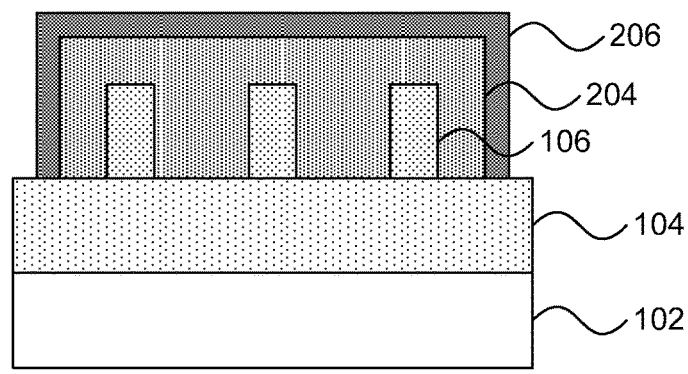
FIG. 2 is a cross-sectional view of a step in forming field effect transistors having non-merged fin extensions in accordance with the present principles.

Referring now to FIG. 2, a cutaway view of a step in forming non-merged source/drain regions is shown. A dummy gate 204 is formed over the fins 106 and may be formed from, for example, polysilicon. A spacer 206 is formed around the dummy 204 gate on all sides. The spacer 206 may be formed in parts be, for example forming a hardmask cap over the dummy gate 204 and then forming hardmask sidewalls around the dummy gate 204. The spacer 206 may be formed from, e.g., silicon nitride or any other appropriate hardmask material and may have any suitable thickness. The spacer 206 serves to protect the dummy gate 204 and portions of the underling fins 106 from subsequent etches and growth processes.

Figure 3:
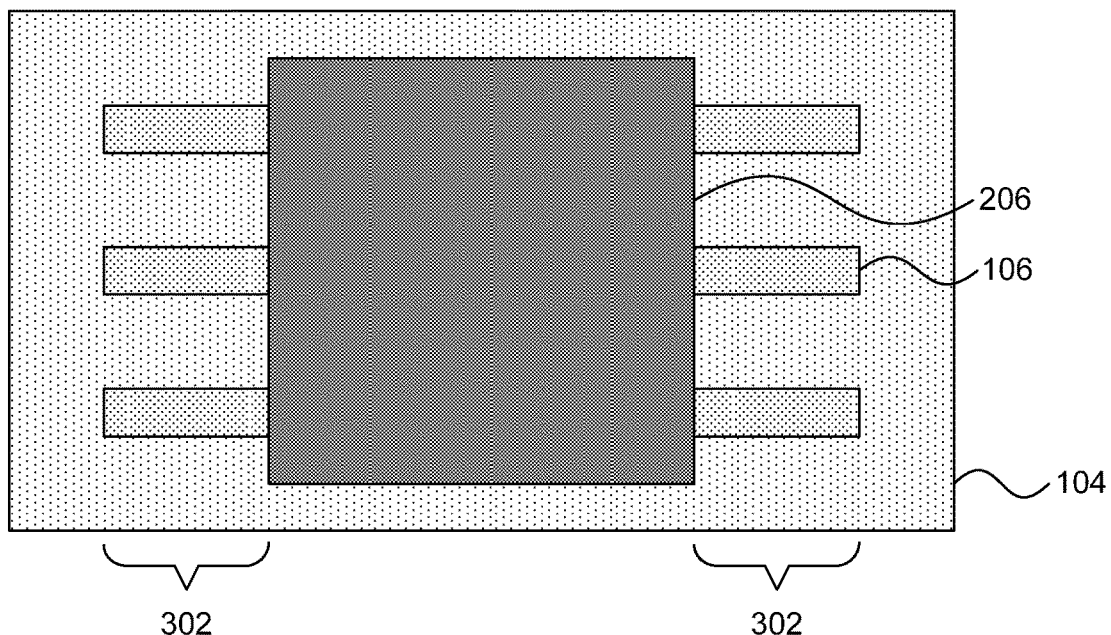
FIG. 3 is a top-down view of a step in forming field effect transistors having non-merged fin extensions in accordance with the present principles.

Referring now to FIG. 3, a top-down view of the step of FIG. 2 is shown. The fins 106 extend beyond the edges of the gate 204 and spacer 206 into source and drain regions 302. The regions of fins 106 beneath the gate 204 and spacer 206 are protected, while the source and drain regions 302 remain exposed.

Figure 4:
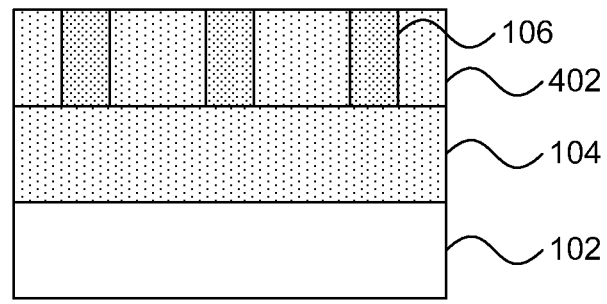
FIG. 4 is a cross-sectional view of a step in forming field effect transistors having non-merged fin extensions in accordance with the present principles.

Referring now to FIG. 4, a cutaway view of a step in forming non-merged source/drain regions is shown. This view is a cutaway of a source/drain region 302, outside of the gate 204 and spacer 206. An insulator layer 402 is deposited between and around the fins 106, leaving the top surface of the fins 106 exposed. The insulator layer 402 may be formed with a flowable chemical vapor deposition process that deposits, for example, silicon dioxide. The deposition may result in the insulator layer 402 being above the tops of fins 106. In this case, the insulator layer 402 may be polished in a chemical mechanical planarization step and then etched down to the level of the fins 106. As an alternative to chemical mechanical planarization, which might accidentally polish away the gate 204, an etch of the insulator 402 may be performed instead. By controlling etch chemistry, the insulator 402 may be preferentially etched compared to the fins 106.

Figure 5:
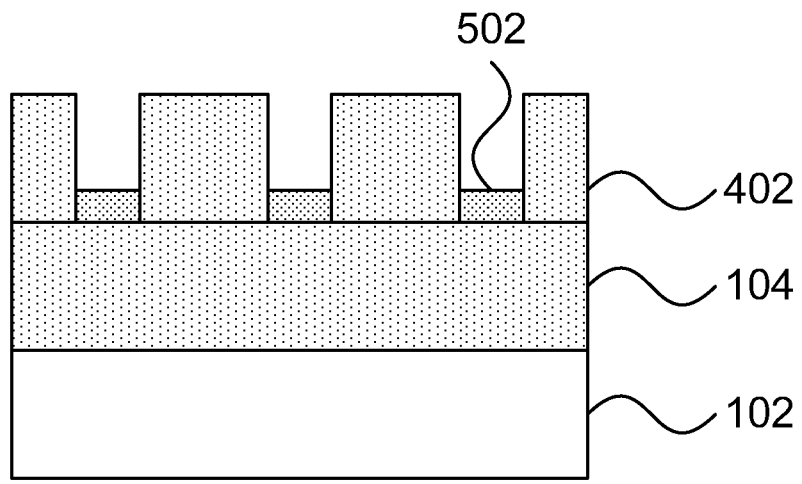
FIG. 5 is a cross-sectional view of a step in forming field effect transistors having non-merged fin extensions in accordance with the present principles.

Referring now to FIG. 5, a cutaway view of a step in forming non-merged source/drain regions is shown. The fins 106 in the source/drain regions 302 are etched down below the level of the insulator layer 402. This etch may be performed using any appropriate etch, including an isotropic etch, such as a wet chemical etch, or an anisotropic etch, such as a reactive ion etch. The etched fins 502 are brought down to a small thickness. For example, the etched fins may be reduced to a thickness of about 5 nm.

Figure 6:
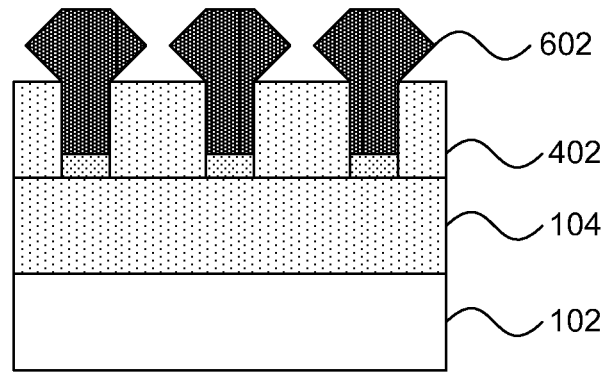
FIG. 6 is a cross-sectional view of a step in forming field effect transistors having non-merged fin extensions in accordance with the present principles.

Referring now to FIG. 6, a cutaway view of a step in forming non-merged source/drain regions is shown. Fin extensions 602 are epitaxially grown from the etched fins 502. When the growth rises above the level of the insulator layer 402, it naturally begins to expand laterally as well as vertically, maintaining the <100> crystal configuration of the etched fins' top surfaces such that a top surface of the fin extensions 602 will keep the same crystal orientation as the top surface of the etched fins 502. In this figure, the fins are not merged. In contrast to conventional epitaxial growth, where growth from the <110> and <100> surfaces might interfere and cause uncertainty as to when and where the fins will merge, embodiments of the present principles provide the ability to predictably control the merging of the fins if desired. It should be recognized that, although the present embodiments provide for growth from the <100> surfaces of the fins 106, any suitable crystal orientation may be used instead.

As shown in the figure, the fin extensions 602 will take on a "mushroom" shape that expands outward. The uniform crystal growth provides expansion of the fin extensions 602 at a predictable rate. This allows for accurate determinations to be made regarding the amount of time to perform the growth, such that the fin extensions 602 may be grown as large as possible without contacting one another. The same principles may be employed to produce fin extensions 602 having any desired size, including merging the fins if that is appropriate to a given application.

When a crystal is epitaxially grown, the crystal orientation of a seed crystal determines the crystal orientation of the grown material. This step can be performed using any appropriate form of crystal epitaxy including the use of gaseous and/or liquid precursors. It should be noted that the fin extensions 602 may be formed from the same semiconductor material as fins 106 or may be formed from another semiconductor having a compatible crystalline structure. Furthermore, the fin extensions 602 may be in situ doped with, e.g., boron or phosphorus. For example, if a gaseous epitaxy process is used, dopants may be added to the source gas in a concentration appropriate to the desired dopant concentration in the fin extensions 602.

Figure 7:
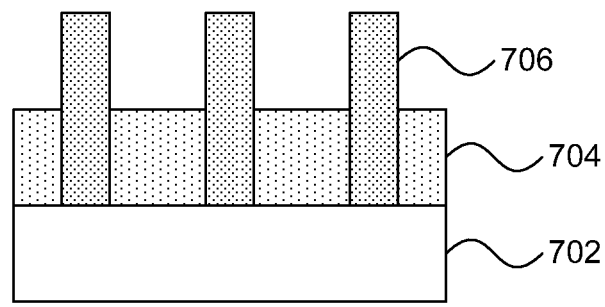
FIG. 7 is a cross-sectional view of a step in an alternative embodiment of forming field effect transistors having non-merged fin extensions in accordance with the present principles.

Referring now to FIG. 7, a cutaway view of a step in forming an alternative embodiment of non-merged source/drain regions is shown. Rather than forming fins 706 on top of insulator layer 704, trenches are formed in the insulator layer 704 and the fins are formed directly on the substrate 702. The trenches in insulator layer 704 may be formed by any appropriate etch process.

A gate 204 and spacer 206 may be formed over the fins 706 in the manner described above with respect to FIGS. 2 and 3. The spacer 206 leaves part of the fins 706 on either side uncovered, creating source and drain regions 302 as shown above.

Figure 8:
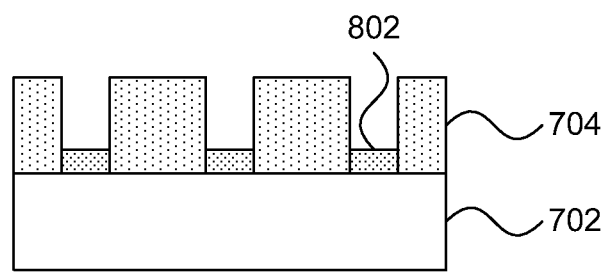
FIG. 8 is a cross-sectional view of a step in an alternative embodiment of forming field effect transistors having non-merged fin extensions in accordance with the present principles.

Referring now to FIG. 8, a cutaway view of a step in forming an alternative embodiment of non-merged source/drain regions is shown. The fins 802 are etched down below the level of the insulator layer 704. This etch may be performed using any appropriate etch, including an isotropic etch, such as a wet chemical etch, or an anisotropic etch, such as a reactive ion etch. The etched fins 802 are brought down to a small thickness. For example, the etched fins may be reduced to a thickness of about 5 nm.

Figure 9:
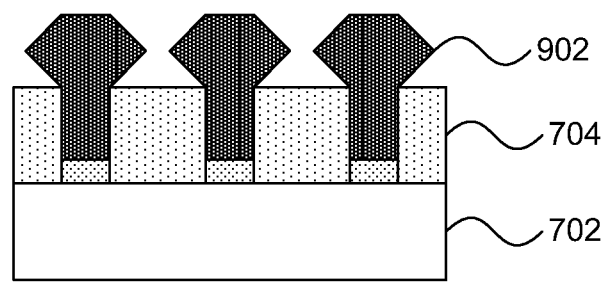
FIG. 9 is a cross-sectional view of a step in an alternative embodiment of forming field effect transistors having non-merged fin extensions in accordance with the present principles.

Referring now to FIG. 9, a cutaway view of a step in forming an alternative embodiment of non-merged source/drain regions is shown. Fin extensions 902 are epitaxially grown from the etched fins 802. When the growth rises above the level of the insulator layer 704, it naturally begins to expand laterally as well as vertically, maintaining the <100> crystal configuration of the etched fins' top surfaces. In this figure, the fins are not merged. In contrast to conventional epitaxial growth, where growth from the <110> and <100> surfaces might interfere and cause uncertainty as to when and where the fins will merge, embodiments of the present principles provide the ability to predictably control the merging of the fins. It should be noted that the fin extensions 902 may be formed from the same semiconductor material as fins 706 or may be formed from another semiconductor having a compatible crystalline structure. Furthermore, the fin extensions 902 may be in situ doped with, e.g., boron or phosphorus.

Figure 10:
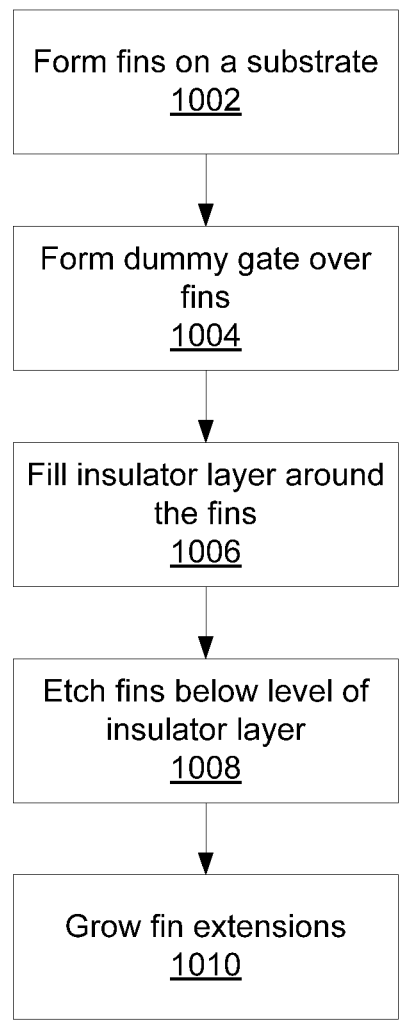
FIG. 10 is a block/flow diagram of a method for forming non-merged fin extensions in accordance with the present principles.

Referring now to FIG. 10, a method for forming non-merged source/drain regions is shown. Block 1002 forms fins 106 on a substrate. In the present embodiments the substrate is shown as having an insulator layer 104 on a bulk semiconductor layer 102, but the present principles may also be embodied on a bulk semiconductor substrate. Block 1004 forms a dummy gate 204 over the fins 106 including a spacer 206. The dummy gate 204 and spacer 206 cover only a middle portion of the fins 106, leaving the source and drain regions 302 exposed.

Block 1006 deposits an insulator layer 402 around the fins 106 using, for example, a flowable chemical vapor deposition process. Block 1006 may also include a chemical mechanical planarization process to expose the top of the fins 106. Block 1108 performs an etch of the fin 106 down below the surface level of the insulator layer 402. This etch may be performed using any appropriate etch, including an isotropic etch, such as a wet chemical etch, or an anisotropic etch, such as a reactive ion etch. The etched fins 502 are brought down to a small thickness. For example, the etched fins 502 may be reduced to a thickness of about 5 nm. Block 1010 then forms fin extensions 602 by epitaxially growing from the top surfaces of the etched fins 502.

Figure 11:
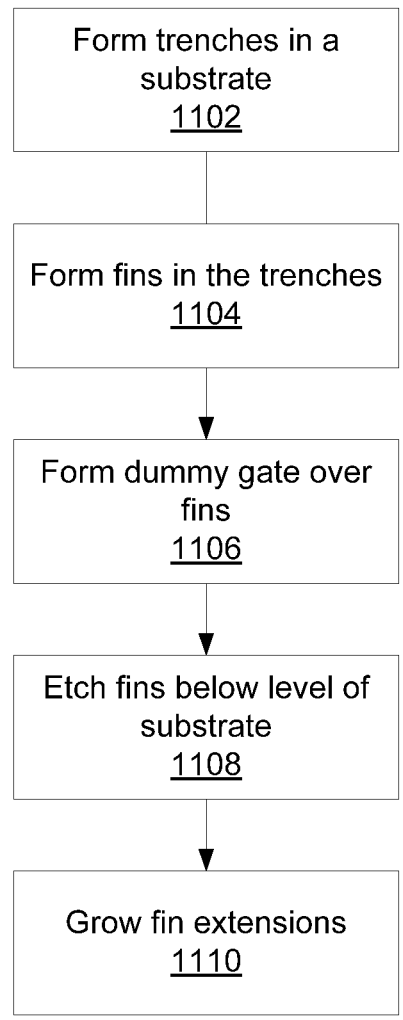
FIG. 11 is a block/flow diagram of an alternative embodiment of a method for forming non-merged fin extensions in accordance with the present principles.

Referring now to FIG. 11, a method for forming non-merged source/drain regions is shown. Block 1102 forms trenches in an insulator layer 104 using any appropriate etching process. Block 1104 forms fins 706 in the trenches. In the present embodiments the substrate is shown as having an insulator layer 704 on a bulk semiconductor layer 702. Block 1106 forms a dummy gate 204 over the fins 706 including a spacer 206. The dummy gate 204 and spacer 206 cover only a middle portion of the fins 706, leaving the source and drain regions 302 exposed.

Block 1108 performs an etch of the fin 106 down below the surface level of the insulator layer 704. This etch may be performed using any appropriate etch, including an isotropic etch, such as a wet chemical etch, or an anisotropic etch, such as a reactive ion etch. The etched fins 802 are brought down to a small thickness. For example, the etched fins 802 may be reduced to a thickness of about 5 nm. Block 1110 then forms fin extensions 902 by epitaxially growing from the top surfaces of the etched fins 802.

Having described preferred embodiments of non-merged epitaxially grown MOSFET devices and methods of forming the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a plurality of fins formed in trenches in an insulator layer, each of the plurality of fins having a uniform crystal orientation, an etched seed layer directly on a substrate, formed from a material that is different from a material of the substrate, and an epitaxially grown fin extension, formed from a material that is different from a material of the etched seed layer, that includes a fin cap in a source and drain region that extends vertically and laterally beyond the trench and has a flat top surface, wherein the fin caps of the respective fins are separate from one another, wherein a region extending from a lowest height of lateral extensions of the fin caps to the substrate and between the fins is completely filled by the insulator layer, and wherein the flat top surface has a same crystal orientation as a top surface of the etched seed layer.

2. The semiconductor device of claim 1, wherein the fin caps have a uniform crystal orientation of <100>.

3. The semiconductor device of claim 1, wherein the trenches fully penetrate the insulator layer, such that the plurality of fins rest on a semiconductor layer.

4. The semiconductor device of claim 1, further comprising a gate structure formed over the fins that leaves the source and drain regions exposed.

5. The semiconductor device of claim 4, further comprising a spacer layer formed over the gate structure.

6. The semiconductor device of claim 1, wherein the fin caps are doped.

7. A semiconductor device, comprising:
a plurality of fins formed in trenches in an insulator layer, each of the plurality of fins having a uniform crystal orientation and comprising an etched seed layer formed directly on a substrate, formed from a material that is different from a material of the substrate, and an in situ doped, epitaxially grown fin extension in a source and drain region, formed from a material different from a material of the etched seed layer, that extends vertically and laterally beyond the trench and has a flat top surface, wherein the fin extensions of the respective fins are separate from one another, wherein a region extending from a lowest height of a lateral fin extension beyond the trench and between the fins is completely filled by the insulator layer, and wherein the flat top surface has a same crystal orientation as a top surface of the etched seed layer.

8. The semiconductor device of claim 7, wherein the fin extensions have a uniform crystal orientation of <100>.

9. The semiconductor device of claim 7, wherein the trenches fully penetrate the insulator layer, such that the plurality of fins rest on a semiconductor layer.

10. The semiconductor device of claim 7, further comprising a gate structure formed over the fins that leaves the source and drain regions exposed.

11. The semiconductor device of claim 10, further comprising a spacer layer formed over the gate structure.

* * * * *